(12) United States Patent
Ciou et al.

(10) Patent No.: US 11,302,787 B2
(45) Date of Patent: Apr. 12, 2022

(54) INTEGRATED CIRCUIT LAYOUTS WITH SOURCE AND DRAIN CONTACTS OF DIFFERENT WIDTHS

(71) Applicant: TAIWAN SEMICONDUCTOR MANUFACTURING COMPANY LTD., Hsinchu (TW)

(72) Inventors: Shang-Syuan Ciou, Hsinchu (TW); Hui-Zhong Zhuang, Kaohsiung (TW); Jung-Chan Yang, Longtan Township (TW); Li-Chun Tien, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 105 days.

(21) Appl. No.: 16/580,779

(22) Filed: Sep. 24, 2019

(65) Prior Publication Data

US 2020/0135869 A1 Apr. 30, 2020

Related U.S. Application Data

(60) Provisional application No. 62/753,460, filed on Oct. 31, 2018.

(51) Int. Cl.
| | |
|---|---|
| *H01L 29/41* | (2006.01) |
| *H01L 29/417* | (2006.01) |
| *H01L 29/78* | (2006.01) |
| *H01L 29/08* | (2006.01) |

(52) U.S. Cl.
CPC ...... *H01L 29/4175* (2013.01); *H01L 29/0843* (2013.01); *H01L 29/7833* (2013.01)

(58) Field of Classification Search
CPC ............ H01L 29/4175; H01L 29/0843; H01L 29/7833
See application file for complete search history.

(56) References Cited

U.S. PATENT DOCUMENTS

| | | | |
|---|---|---|---|
| 7,260,442 B2 | 8/2007 | Hwang et al. | |
| 9,231,106 B2* | 1/2016 | Tseng | H01L 21/30604 |
| 9,256,709 B2 | 2/2016 | Yu et al. | |
| 9,882,002 B2* | 1/2018 | Tseng | H01L 29/7835 |
| 2012/0086054 A1* | 4/2012 | Cheng | H01L 29/7833 |
| | | | 257/288 |
| 2014/0040838 A1 | 2/2014 | Liu et al. | |
| 2014/0252477 A1* | 9/2014 | Tseng | H01L 29/785 |
| | | | 257/347 |
| 2015/0278429 A1 | 10/2015 | Chang | |
| 2016/0027499 A1* | 1/2016 | Liaw | G11C 8/16 |
| | | | 365/154 |
| 2016/0118462 A1* | 4/2016 | Tseng | H01L 27/0886 |
| | | | 257/386 |

* cited by examiner

*Primary Examiner* — Lex H Malsawma
(74) *Attorney, Agent, or Firm* — Hauptman Ham, LLP

(57) ABSTRACT

A semiconductor device includes an active region in a substrate. The active region extends in a first direction. The semiconductor device further includes a gate structure extending in a second direction different from the first direction. The gate structure extends across the active region. The semiconductor device further includes a plurality of source/drain contacts extending in the second direction and overlapping a plurality of source/drain regions in the active region on opposite sides of the gate structure. A first source/drain contact of the plurality of source/drain contacts has a first width, and a second source/drain contact of the plurality of source/drain contacts has a second width less than the first width.

20 Claims, 11 Drawing Sheets

INTEGRATED CIRCUIT LAYOUTS WITH SOURCE AND DRAIN CONTACTS OF DIFFERENT WIDTHS

PRIORITY CLAIM

This application claims the priority of U.S. Application No. 62/753,460, filed Oct. 31, 2018, which is incorporated herein by reference in its entirety.

BACKGROUND

The semiconductor industry is producing smaller and faster electronic devices for portable electronic, such as personal computers, cell phones and digital cameras applications. In order to produce these devices, the semiconductor manufacturer is striving to produce low-cost, high-performance, and low-power integrated circuits. Smaller and faster electronic devices are produced in large part by scaling down the size of circuit components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
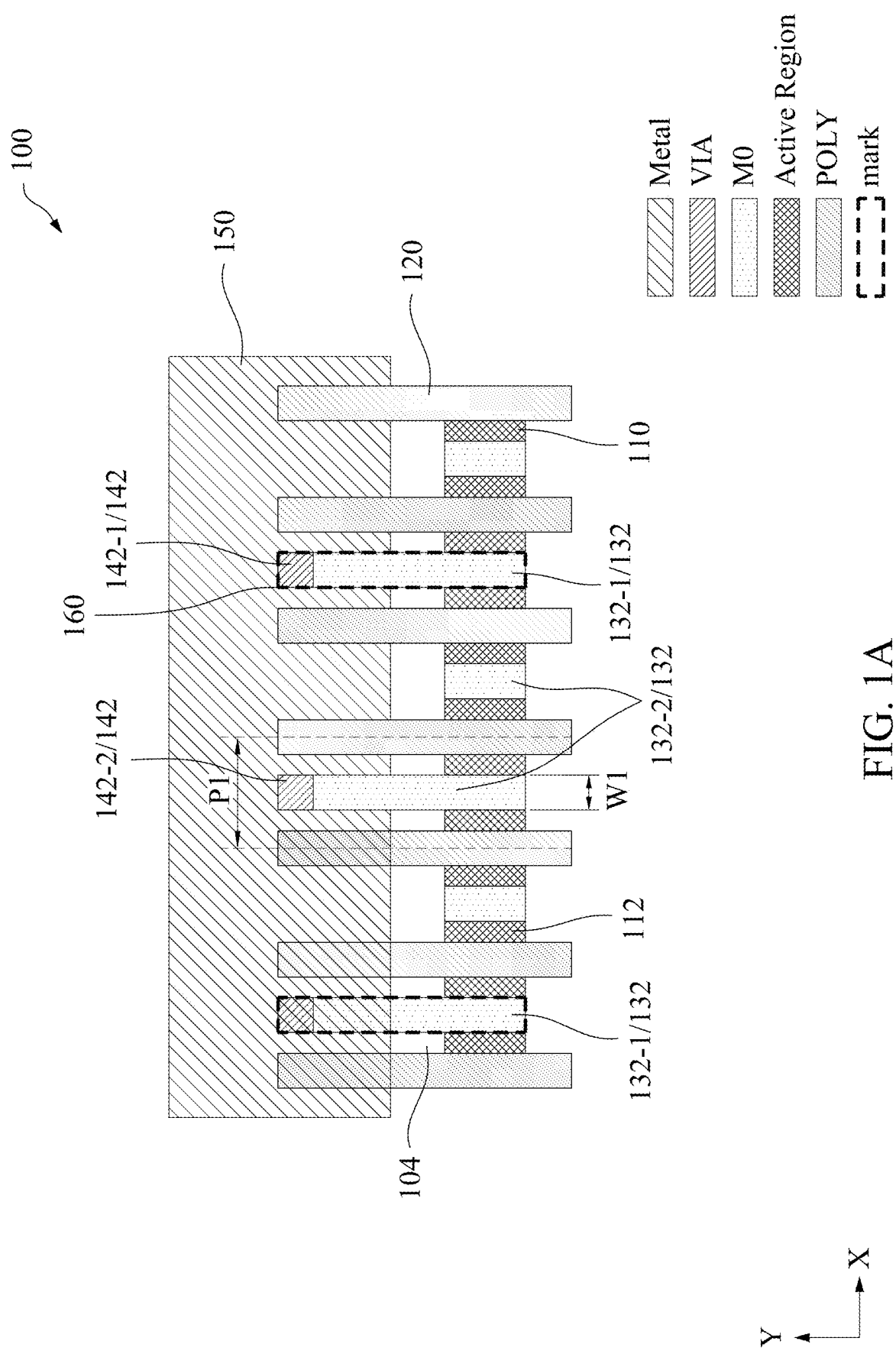
FIG. 1A is a diagram of a layout of a semiconductor device, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Field effect transistors (FETs) are components of some integrated circuits. A FET includes a channel region and also a source region and a drain region (collectively referred to source/drain regions) spaced apart by the channel region. A gate electrode is over the channel region. By applying a voltage to the gate electrode, the conductivity of the channel region increases to allow current to flow from the source region to the drain region. A FET utilizes conductive contacts (i.e., source/drain contacts) that electrically connect to source/drain regions to conduct current to and from the FET. A source/drain contact resistance in a FET is proportional to the size of the source/drain contact. A source/drain contact with a larger footprint provides a greater electrical contact area, thus reducing the contact resistance between the source/drain contact and a corresponding source/drain region. Reduced contact resistance at the source/drain regions of the FET facilitates current passing into/out of the FET through the source/drain contacts, which leads to an increase in switching speed for the FET.

Scaling of FETs reduces the source/drain contract areas. The contact resistance thus increases, which limits the performance of the FETs. In some approaches, the source/drain contacts formed over a same active region have a uniform width, the FETs formed on the same active region thus have the same source/drain contact resistance. In some instances, FETs formed on the same active region perform different functions which have different design specifications for source/drain contact resistance. For example, source/drain contacts for FETs used for high speed switching are specified to have a low source/drain contact resistance, while source/drain contacts for FETs used for feedback have a design specification that permits a higher source/drain contact resistance. A layout design which allows tailoring source/drain contact resistance for different types of FETs on the same active region helps to maximize performance of integrated circuits.

In the present disclosure, in a layout design of a semiconductor device, each of one or more source/drain contact layout patterns of a plurality of source/drain contact layout patterns for FETs formed on a same active region layout pattern is marked by a mark layer. The mark layer is usable to indicate that when fabricating the semiconductor device based on the layout design, each of one or more source/drain contacts of the plurality of source/drain contacts corresponding to a source/drain layout pattern marked by the mark layer has a width greater than a width of source/drain contacts corresponding to the non-marked source/drain layout patterns. Selectively labeling source/drain contact layout patterns formed on the same active region layout pattern using the mark layers at the layout design stage helps to generate FETs with tailored contact resistance, which in turn helps to improve the overall performance of the FETs.

Figure 1B:
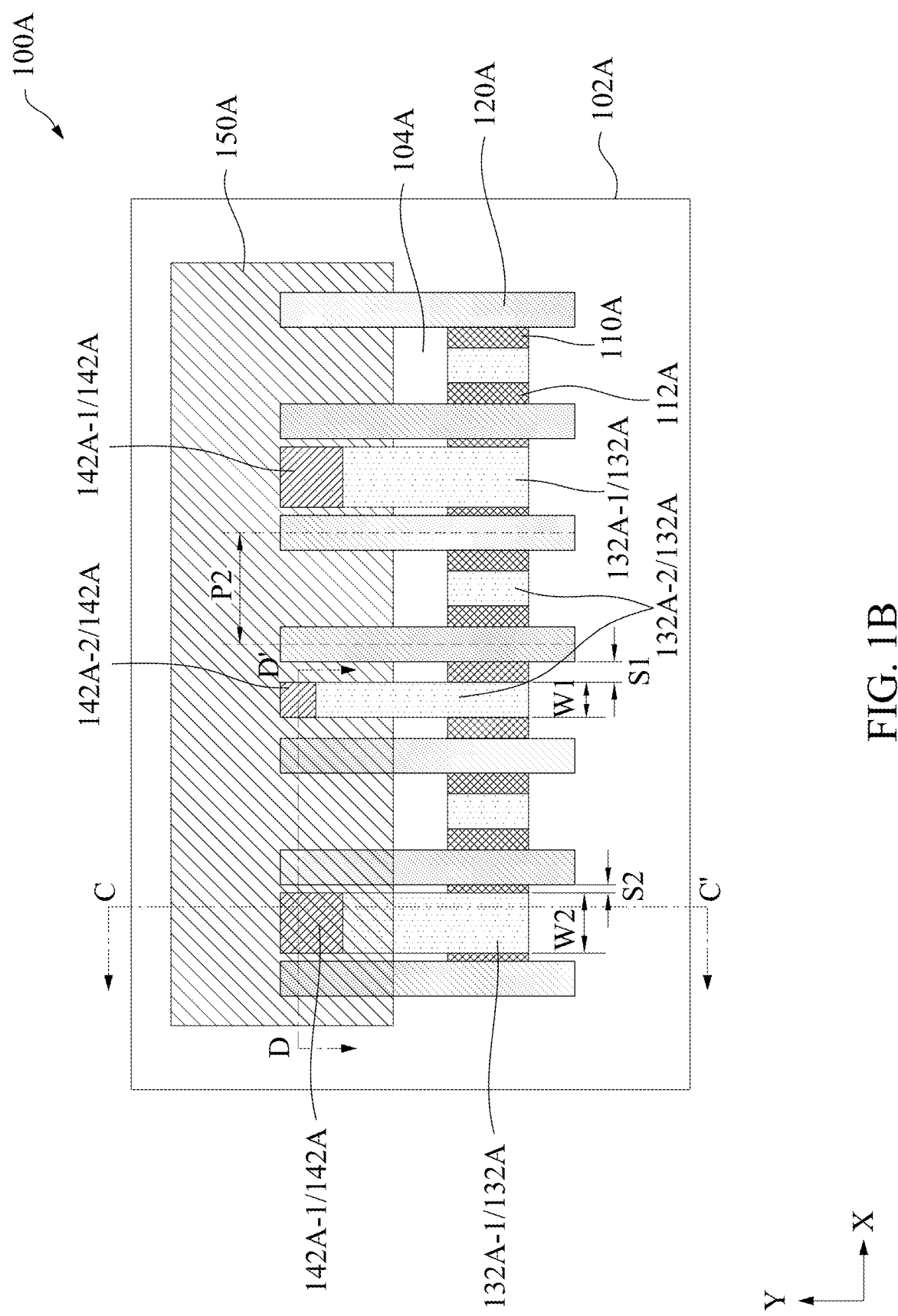
FIGS. 1B-1D are views of a semiconductor device having the layout of FIG. 1A, in accordance with some embodiments.
Figures 1C, 1D:
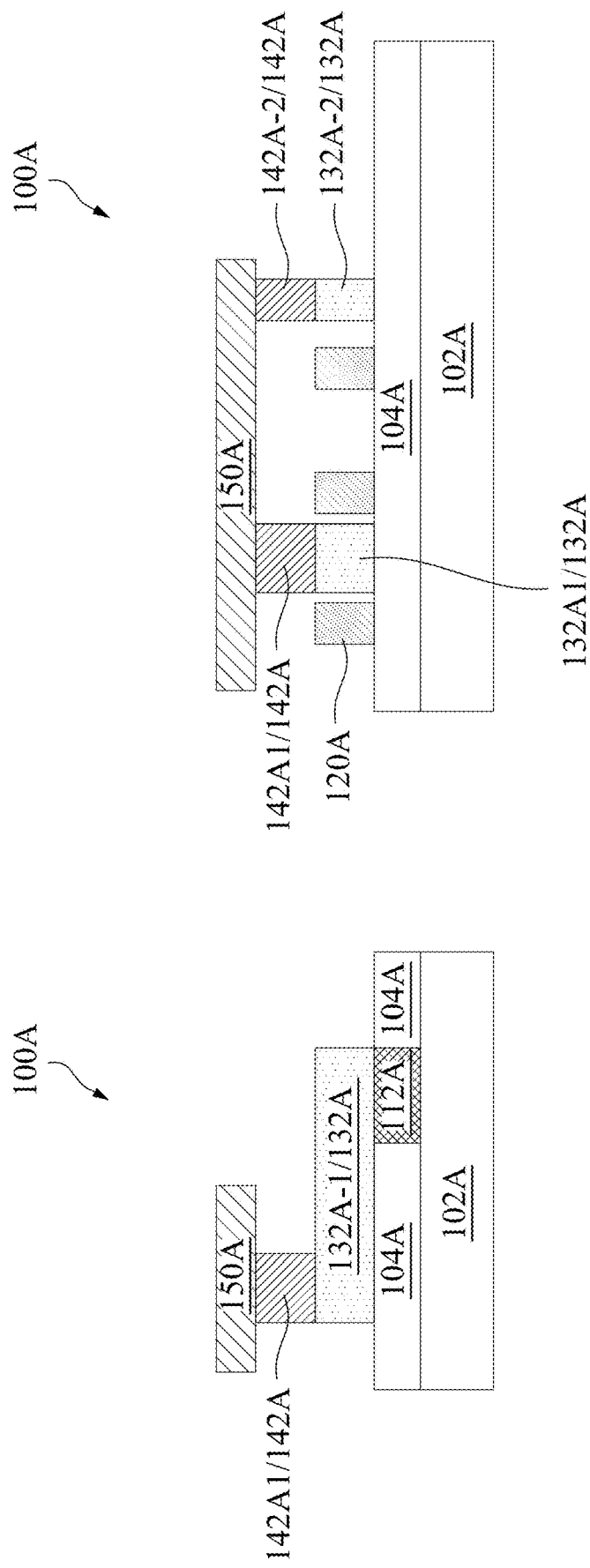

FIG. 1A is a diagram of a layout 100 of a semiconductor device, in accordance with some embodiments. The layout 100 is usable to manufacture a semiconductor device 100A (FIGS. 1B-1D).

Referring to FIG. 1A, the layout 100 includes an active region layout pattern 110. The active region layout pattern 110 defines a corresponding active region 110A (FIGS. 1B-1D) of the semiconductor device 100A. The active region layout pattern 110 extends along a first direction of the layout 100, e.g., the X direction. In some embodiments, the active region layout pattern 110 is also referred to as an oxide-definition (OD) region layout pattern. The active region layout pattern 110 is identified in the legend in the drawings with label "Active Region." The active region layout pattern 110 includes source region layout patterns and drain region layout patterns (collectively referred to as source/drain region layout patterns 112) that define corresponding source/drain regions 112A of the semiconductor device 100A.

The active region layout pattern 110 is separated from other components of the layout 100 on the same layout level by an isolation structure layout pattern 104. The isolation structure layout pattern 104 defines a corresponding isolation structure 104A (FIGS. 1B-1D) of the semiconductor device 100A.

The layout 100 further includes a plurality of gate layout patterns 120 over the active region layout pattern 110. The gate layout patterns 120 define corresponding gate structures 120A (FIGS. 1B-1D) of the semiconductor device 100A. Each of the gate layout patterns 120 extends along a second direction of the layout 100, e.g., the Y-direction across the active region layout pattern 110. In some embodiments, the second direction Y is perpendicular to the first direction X. Each gate layout pattern 120 is separated from an adjacent gate layout pattern 120 in the first direction X by a pitch P1. The gate layout patterns 120 and corresponding source/drain region layout patterns 112 on opposite sides of the gate layout patterns 120 form a plurality of FETs. In some embodiments, the gate layout patterns 120 are also referred to as POLY layout patterns and are identified in the legend in the drawings with label "POLY."

The layout 100 further includes a plurality of source/drain contact layout patterns 132 overlying the source/drain region layout patterns 112 to provide electrical connections to the source/drain region layout patterns 112. The source/drain contact layout patterns 132 define corresponding source/drain contacts 132A of the semiconductor device 100A (FIGS. 1B-1D). Each of the source/drain contact layout patterns 132 extends in the second direction Y and overlaps a corresponding source/drain region layout pattern 112 between a corresponding pair of adjacent gate layout patterns 120. The source/drain contact layout patterns 132 are set to have a uniform width W1 in the first direction X. In some embodiments, the source/drain contact layout patterns 132 are also referred to as metal over diffusion layout patterns and are identified in the legend in the drawings with label "M0."

The layout 100 further includes a plurality of via layout patterns 142 overlying source/drain contact layout patterns 132. The via layout patterns 142 define corresponding vias 142A (FIGS. 1B-1D) of the semiconductor device 100A. The via layout patterns 142 overlaps corresponding source/drain contact layout patterns 132, providing electrical connections to the corresponding source/drain contact patterns 132.

The layout 100 further includes a metal layer layout pattern 150 overlying via layout patterns 142. The metal layer layout pattern 150 defines a corresponding metal layer 150A (FIGS. 1B-1D) of the semiconductor device 100A. The metal layer layout pattern 150 extends in the first direction X and is electrically coupled to the corresponding source/drain contact layout patterns 132 by via layout patterns 142. The metal layer layout pattern 150 is identified in the legend in the drawing with label "Metal."

The layout 100 further includes one or more mark layers 160. Each of the mark layers 160 is used to label a corresponding source/drain contact layout pattern 132. Each of one or more mark layers 160 is usable to indicate that a corresponding source/drain contact layout pattern 132 labeled by a mark layer 160 (herein referred to as marked source/drain contact layout pattern 132-1) has a width greater than a width (i.e., W1) of a source/drain contact layout pattern 132 that is not labeled by a mark layer 160 (herein referred to as non-marked source/drain contact layout pattern 132-2). Each of one or more mark layers 160 is also usable to indicate that a corresponding via layout pattern 142 overlying the marked source/drain contact layout pattern 132-1 (herein referred to as marked via layout pattern 142-1) has a dimension greater than a dimension of a via layout patterns 142 overlying a non-marked source/drain contact layout pattern 132-2 (herein referred to as non-marked via pattern 142-2). The number of mark layers 160 employed in the layout 100 is determined based on the circuit design. In the layout 100, by using one or more mark layers 160 to indicate that when fabricating a semiconductor device 100A (FIGS. 1B-1D) based on the layout 100, one or more source/drain contacts 132A in the semiconductor device 100A are formed with an increased width, the layout design of the present disclosure allows forming a semiconductor device 100A with a reduced overall contact resistance. As a result, the performance of the semiconductor device 100A is enhanced.

FIGS. 1B-1D are views of a semiconductor device 100A having the layout 100, in accordance with some embodiments. FIG. 1B is a top view of the semiconductor device 100A. FIG. 1C is a cross-sectional view of the semiconductor device 100A of FIG. 1B taken along line C-C'. FIG. 1D is a cross-sectional view of the semiconductor device 100A of FIG. 1B taken along line D-D'. The semiconductor device 100A is a non-limiting example for facilitating the illustration of the present disclosure.

Referring to FIGS. 1B-1D, the semiconductor device 100A includes a substrate 102A over which various elements of the semiconductor device 100A are formed. The substrate 102A includes, but is not limited to, a bulk silicon substrate, a silicon-on-insulator (SOI) substrate, or a silicon geranium substrate. Other semiconductor materials including group III, group IV, and group V elements are within the scope of various embodiments.

The semiconductor device 100A further includes an active region 110A over the substrate 102A, and a plurality of gate structures 120A over the active region 110A.

The active region 110A extends in the first direction X and includes a plurality of source/drain regions 112A. The source/drain regions 112A are doped semiconductor regions located on opposite sides of the gate structures 120A. In some embodiments, the source/drain regions 112A include p-type dopants such as boron for formation of p-type FETs. In other embodiments, the source/drain regions 112A include n-type dopants such as phosphorus for formation of n-type FETs. The active region 110A is electrically isolated for other elements of the semiconductor device 100A by an isolation structure 104A. In some embodiments, the isolation structure 104A is a shallow trench isolation (STI) structure including a trench filled with one or more dielectric material. In some embodiments, the STI structure includes silicon dioxide, silicon nitride, silicon oxynitride, or any other suitable insulating materials.

The gate structures 120A are over respective channel regions of the active region 110A. The gate structures 120A extend in the second direction Y and are separated from each other by a pitch P2. In some embodiments, the pitch P2 of the gate structures 120A is equal to the pitch P1 of the gate layout patterns 120 of layout 100 (FIG. 1A). In some embodiments, in order to accommodate one or more source/drain contacts 132A-1 having an increased width W2 (described below), the pitch P2 of the gate structure 120A is set to be greater than the pitch P1 of the gate layout patterns 120 of layout 100 (FIG. 1A).

In some embodiments, each of the gate structures 120A includes a gate dielectric and a gate electrode. The gate dielectric is formed over a corresponding channel region of the active region 110A. In some embodiments, the gate dielectric includes a high-k dielectric material. Exemplary high-k dielectric materials include, but are not limited to, silicon nitride, silicon oxynitride, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, other suitable high-k dielectric materials, and/or combinations thereof. In some embodiments, the gate dielectric includes a stack of an interfacial dielectric material and a high-k dielectric material. In some embodiments, the interfacial dielectric material includes silicon dioxide. The gate electrode is formed over the gate dielectric. In some embodiments, the gate electrode includes a doped polysilicon. In other embodiments, the gate electrode includes a conductive material such as, for example copper (Cu), aluminum (Al), titanium (Ti), titanium nitride (TiN), tantalum (Ta), tantalum nitride (TaN), tantalum carbide (TaC), tantalum silicon nitride (TaSiN), tungsten (W), tungsten nitride (WN), or molybdenum nitride (MoN).

The semiconductor device 100A further includes a plurality of source/drain contacts 132A overlying corresponding source/drain regions 112A. In some embodiments, source/drain contacts 132A include a conductive material such as, for example, cobalt (Co), Cu, or W. The source/drain contacts 132A include a first set of source/drain contacts 132A-1 corresponding to the marked source/drain contact layout patterns 132-1 of layout 100 and a second set of source/drain contacts 132A-2 corresponding to the non-marked source/drain contact layout patterns 132-2 of layout 100 (FIG. 1A).

The source/drain contacts 132A-1 in the first set are configured to have a width W2, while the source/drain contacts 132A-2 in the second set are configured to have a width W1 smaller than W2. The spacing S2 between each source/drain contact 132A-1 in the first set and a corresponding adjacent gate structure 120A thus is smaller than the spacing S1 between each source/drain contact 132A-2 in the second set and a corresponding adjacent gate structure 120A. Precise dimensions for pitch P1, pitch P2, width W1, width W2, spacing S1 and spacing S2 are determined based on a node size of the FET being manufactured. In some embodiments, P1 ranges from about 40 nm to about 90 nm. If P1 is too small, then manufacturing of the device associated with the layout 100 has a higher risk of a defect, in some instances. If P1 is too large, then a size of the device associated with the layout 100 is unnecessarily increased, in some instances. In some embodiments, P2 ranges from about 40 nm to about 90 nm. If P2 is too small, then manufacturing of the device associated with the layout 100 has a higher risk of a defect, in some instances. If P2 is too large, then a size of the device associated with the layout 100 is unnecessarily increased, in some instances. In some embodiments, W1 ranges from about 16 nm to about 54 nm. If W1 is too small, then contact resistance is increased and a risk of the device associated with the layout 100 not meeting design specifications increases, in some instances. If W1 is too large then a size of the device associated with the layout 100 is unnecessarily increased, in some instances. In some embodiments, a ratio between W2 and W1 ranges from about 1 to about 5. If W2 is too small, then contact resistance is increased and a risk of the device associated with the layout 100 not meeting design specifications increases, in some instances. If W2 is too large then a size of the device associated with the layout 100 is unnecessarily increased, in some instances. In some embodiments, S1 ranges from about 10 nm to about 74 nm. If S1 is too small, then manufacturing of the device associated with the layout 100 has a higher risk of a defect, in some instances. If S1 is too large, then a size of the device associated with the layout 100 is unnecessarily increased, in some instances. In some embodiments, a ratio between S2 and S1 ranges from about 1 to about 5. If S2 is too small, then manufacturing of the device associated with the layout 100 has a higher risk of a defect, in some instances. If S2 is too large, then a size of the device associated with the layout 100 is unnecessarily increased, in some instances. Forming source/drain contacts 132A of different widths on a same active region 110A helps to reduce the overall contact resistance of the semiconductor device 100A, which helps to improve device performance.

The semiconductor device 100A further includes a plurality of vias 142A overlying corresponding source/drain contacts 132A to provide electrical connections to corresponding source/drain contacts 132A. In some embodiments, the vias 142A include a conductive material such as, for example, cobalt (Co), copper (Cu), or tungsten (W). The vias 142A includes a first set of vias 142A-1 overlying corresponding first set of source/drain contacts 132A-1 of greater width W2 and a second set of vias 142A-2 overlying corresponding second set of source/drain contacts 132A-2 of smaller width W1. In some embodiments, the first set of vias 142A-1 are also formed to have an increased dimension in the first direction X and/or the second direction Y. Forming vias 142A-1 with the increased dimension helps to further reduce the overall contact resistance of the semiconductor device 100A, which helps to further improve device performance.

The semiconductor device 100A further includes a metal layer 150A overlying the vias 142A to provide electrical connections to the corresponding vias 142A. The metal layer 150A is a second metal layer M1, which is the second lowermost metal layer above the elements formed over the substrate 102A. In some embodiments, the metal layer 150A include a conductive material such as, for example, Co, Cu, or W.

Figure 2A:
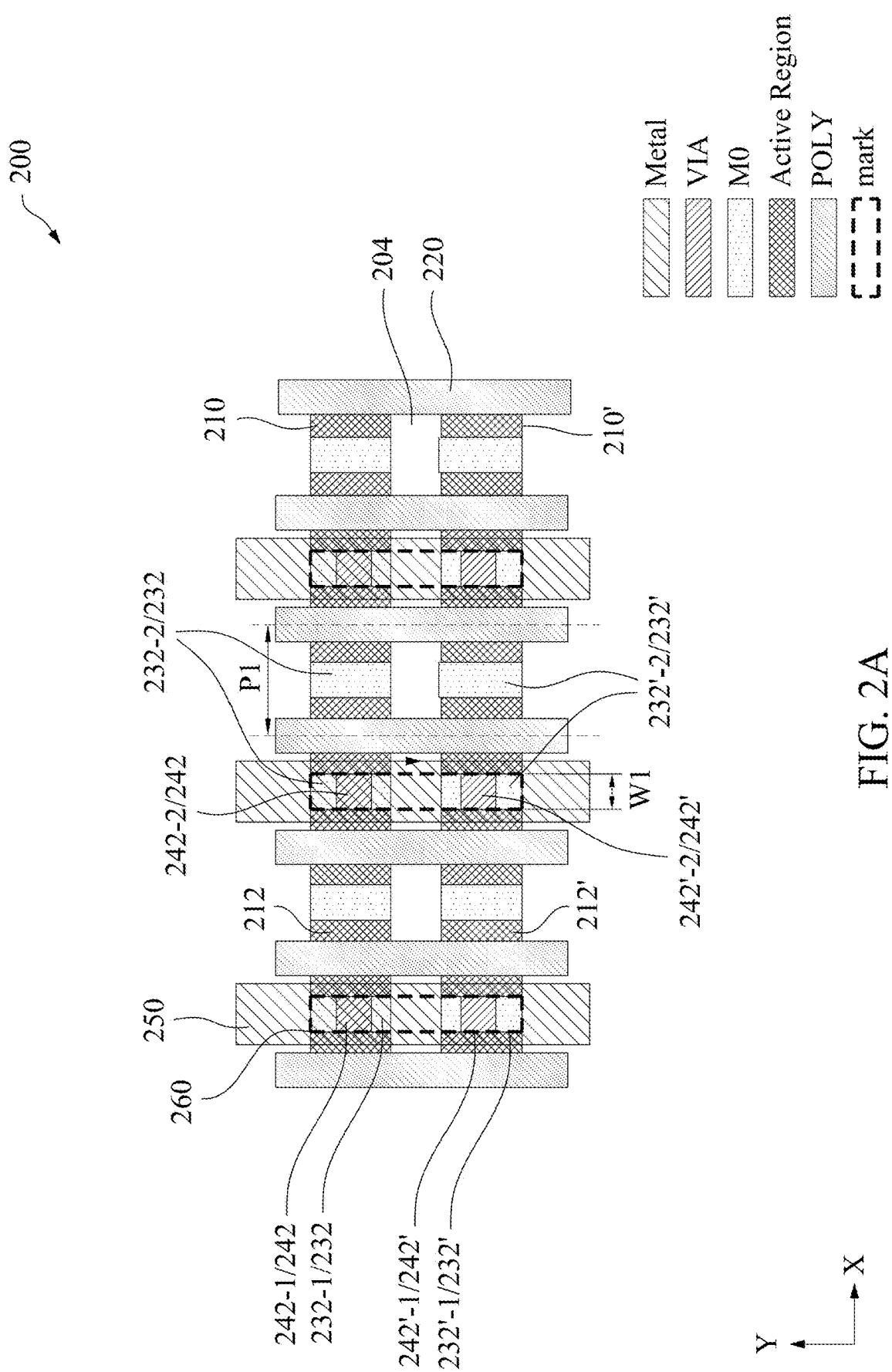
FIG. 2A is a diagram of a layout of a semiconductor device, in accordance with some embodiments.
Figure 2B:
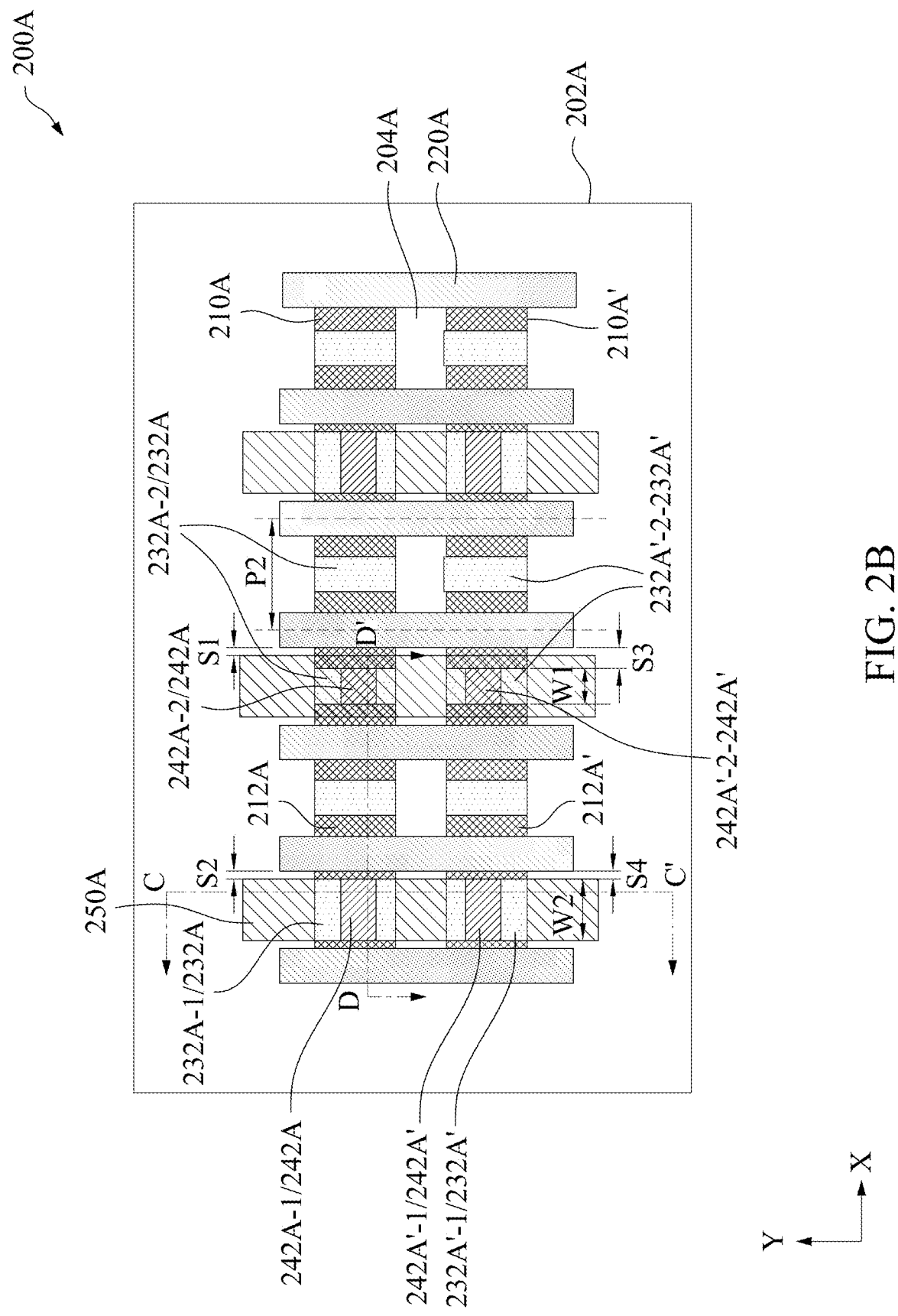
FIGS. 2B-2D are views of a semiconductor device having the layout of FIG. 2A, in accordance with some embodiments.
Figures 2C, 2D:
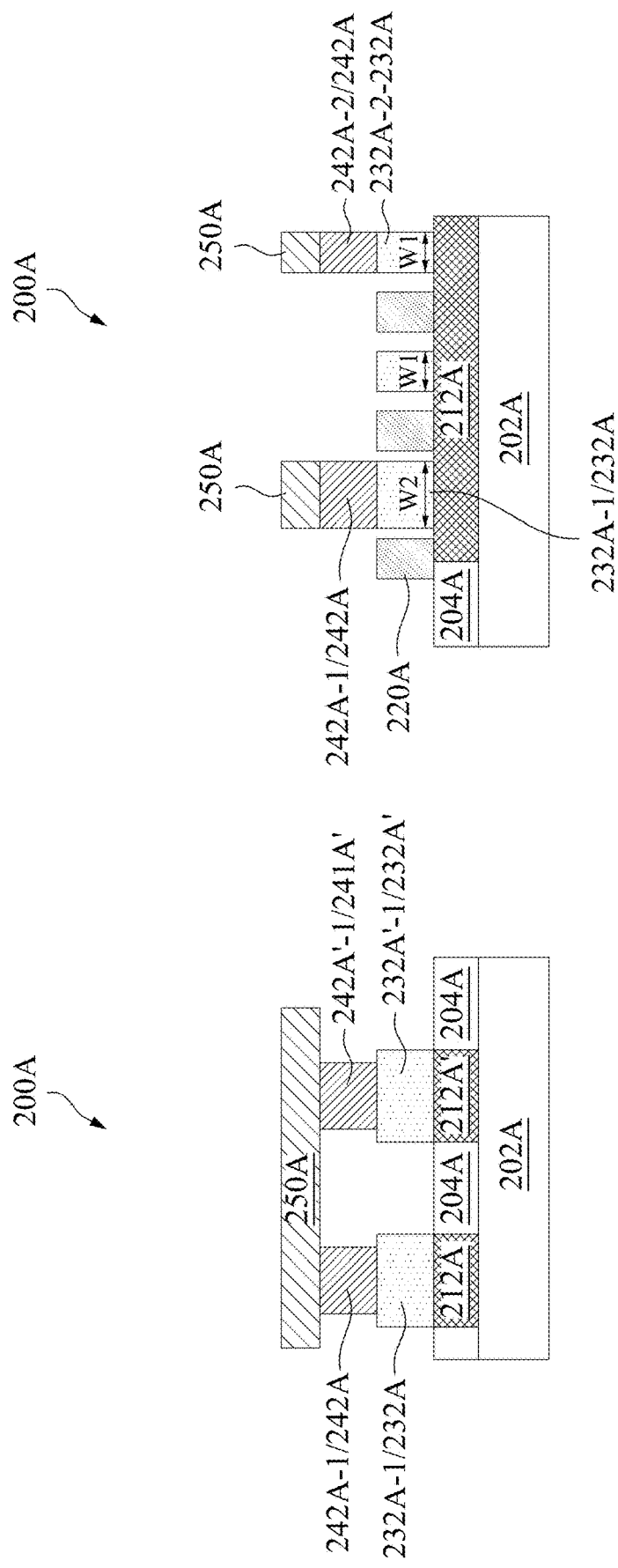

FIG. 2A is a diagram of a layout 200 of a semiconductor device, in accordance with some embodiments. The layout 200 is usable to manufacture a semiconductor device 200A (FIGS. 2B-2D).

Referring to FIG. 2A, the layout 200 includes a plurality of active region layout patterns. A first active region layout pattern 210 and a second active region layout pattern 210' are included in FIG. 2A. The first and second active region layout patterns 210 and 210' define corresponding first and second active regions 210A and 210A' of the semiconductor device 200A (FIGS. 2B-2D). The active region layout patterns 210 and 210' each extend along a first direction of the layout 200, e.g., the X direction, and are separated from each other in a second direction of the layout 200, e.g., the Y direction. In some embodiments, the active region layout patterns 210 and 210' are also referred to as oxide-definition (OD) region layout patterns. The active region layout patterns 210 are identified in the legend in the drawing with the label "Active Region." The first active region layout pattern 210 includes first source region layout patterns and first drain region layout patterns (collectively referred to as first source/drain region layout patterns 212) that define corresponding first source/drain regions 212A of the semiconductor device 200A (FIGS. 2B-2D). The second active region layout pattern 210' includes second source region layout patterns and second drain region layout patterns (collectively referred to as second source/drain region layout patterns 212') that define corresponding second source/drain regions 212A' of the semiconductor device 200A (FIGS. 2B-2D).

Adjacent active region layout patterns (e.g., active region layout patterns 210, 210') of the plurality of active region layout patterns are separated from each other by an isolation structure layout pattern 204. The isolation structure layout patterns 204 define corresponding isolation structures 204A of the semiconductor device 200A (FIGS. 2B-2D).

The layout 200 further includes a plurality of gate layout patterns 220 over the first and second active region layout patterns 210 and 210'. The gate layout patterns 220 define corresponding gate structures 220A of the semiconductor device 200A (FIGS. 2B-2D). Each of the gate layout patterns 220 extends along the second direction Y across the first and second active region layout patterns 210 and 210'. Each gate layout pattern 220 is separated from an adjacent gate pattern 220 in the first direction X by a pitch P1. The gate layout patterns 220 and corresponding first source/drain region layout patterns 212 on opposite sides of the gate layout patterns 220 form a plurality of first FETs in the first active region layout pattern 210. The gate layout patterns 220 and corresponding second source/drain region layout patterns 212' on opposite sides of the gate patterns 220 form a plurality of second transistors in the second active region layout pattern 210'. In some embodiments, the gate layout patterns 220 are also referred to as POLY layout patterns and are identified in the legend in the drawings with label "POLY."

The layout 200 further includes a plurality of first source/drain contact layout patterns 232 overlying the first source/drain region layout patterns 212 and a plurality of second source/drain contact layout patterns 232' overlying the second source/drain region layout patterns 212'. The first source/drain contact layout patterns 232 provides electrical connections to the first source/drain region layout patterns 212. The first source/drain contact layout patterns 232 define corresponding first source/drain contacts 232A of the semiconductor device 200A (FIGS. 2A-2C). Each of the first source/drain contact layout patterns 232 extends in the second direction Y and overlaps a corresponding first source/drain region layout pattern 212 between a corresponding pair of adjacent gate layout patterns 220. The first source/drain contact layout patterns 232 are set to have a uniform width W1 in the first direction X. The second source/drain contact layout patterns 232' provides electrical connections to the second source/drain region layout patterns 212'. The second source/drain contact layout patterns 232' define corresponding second source/drain contacts 232A' of the semiconductor device 200A (FIGS. 2B-2D). Each of the second source/drain contact layout patterns 232' extends in the second direction Y and overlaps a corresponding second source/drain region layout pattern 212' between a corresponding pair of adjacent gate layout patterns 120. The second source/drain contact layout pattern 232' are set to have a width W1 in the first direction X. In some embodiments, source/drain contact layout patterns 232 and 232' are also referred to as metal over diffusion layout patterns and are identified in the legend in the drawings with label "M0."

The layout 200 further includes a plurality of first via layout patterns 242 and a plurality of second via layout patterns 242'. The first via layout patterns 242 define corresponding first vias 242A of the semiconductor device 200A (FIGS. 2B-2D). The first via layout patterns 242 overlap corresponding first source/drain contact layout patterns 232 to provide electrical connections to the corresponding first source/drain contact layout patterns 232. The second via layout patterns 242' define corresponding second vias 242A' of the semiconductor device 210A (FIGS. 2B-2D). The second via layout patterns 242' overlap corresponding second source/drain contact patterns 232' to provide electrical connections to the corresponding second source/drain contact layout patterns 232'.

The layout 200 further includes a plurality of interconnect layout patterns 250. The interconnect layout patterns 250 define corresponding interconnect structures 250A of the semiconductor device 200A (FIGS. 2B-2D). Each of the interconnect layout patterns 250 extends in the second direction Y across a corresponding pair of a first source/drain contact layout pattern 232 and a second source/drain contact layout pattern 232', thereby electrically coupling the corresponding pair of the first source/drain contact pattern 232 and the second source/drain contact patterns 232'. The interconnect layout patterns 250 are electrically coupled to corresponding first source/drain contact layout patterns 232 through first via layout patterns 242, and electrically coupled to corresponding second source/drain contact layout patterns 232' through second via layout patterns 242'. The interconnect layout patterns 250 are also referred to metal interconnect layout patterns and are identified in the legend in the drawing with label "Metal."

The layout 200 further includes one or more mark layers 260 each of which is used to label a corresponding pair of a first source/drain contact layout pattern 232 and a second source/drain contact layout pattern 232'. Each of one or more mark layers 260 is usable to indicate that a corresponding pair of a first source/drain contact layout pattern 232 and a second source/drain contact layout pattern 232' labeled by a mark layer 160 (herein referred to as marked first source/drain contact layout pattern 232-1 and marked second source/drain contact layout pattern 232'-1) have a width greater than a width (e.g., W1) of a pair of a first source/drain contact layout pattern 232 and a second source/drain contact layout patterns 232 that are not labeled by a mark layers 260 (herein referred to as non-marked first source/drain contact layout patterns 232-2 and non-marked second source/drain contact layout pattern 232'-2, respectively). Each of one or more mark layers 260 is also usable to indicate that a first via layout pattern 242 overlying a corresponding marked first source/drain contact layout pattern 232-1 (herein referred to as marked first via layout pattern 242-1) and a second via layout pattern 242' overlying a corresponding marked second source/drain contact layout pattern 232'-1 (herein referred to as marked second via layout pattern 242'-1) each have a dimension greater than a dimension of a first via layout pattern 242 overlying a corresponding non-marked first source/drain contact layout pattern 232-2 (herein referred to non-marked first via layout pattern 242-2) and a second via layout pattern 242' overlying a corresponding non-marked second source/drain contact layout pattern 232-2' (herein referred to non-marked second via layout pattern 242'-2). The number of mark layers 260 employed in the layout 200 is determined based on the circuit design. In the layout 200, by using one or more mark layers 260 to indicate that when fabricating a semiconductor device 200A (FIGS. 2B-2D) based on the layout 200, one or more source/drain contacts 232A in the semiconductor device 200A are formed with an increased contact area, the layout design of the present disclosure allows forming a semiconductor device 200A with a reduced overall contact resistance. As a result, the performance of the semiconductor device 200A is enhanced.

FIGS. 2B-2D are views of a semiconductor device 200A having the layout 200, in accordance with some embodiments. FIG. 2B is a top view of the semiconductor device 200A. FIG. 2C is a cross-sectional view of the semiconductor device 200A of FIG. 2B taken along line C-C'. FIG. 2D is a cross-sectional view of the semiconductor device 200A of FIG. 2B taken along line D-D'. The semiconductor device 200A is a non-limiting example for facilitating the illustration of the present disclosure.

Referring to FIGS. 2B-2D, the semiconductor device 200A includes a substrate 202A over which various elements of the semiconductor device 200A are formed. The substrate 202A includes, but is not limited to, a bulk silicon substrate, an SOI substrate, or a silicon geranium substrate. Other semiconductor materials including group III, group IV, and group V elements are within the scope of various embodiments.

The semiconductor device 200A further includes a plurality of active regions, e.g., a first active region 210A and a second active region 210A' extending along the first direction X, and a plurality of gate structures 220A extending along the second direction Y across the first active region 210A and the second active region 210A'.

The first active region 210A includes a plurality of first source/drain regions 212A on opposite sides of the gate structures 220A. The first source/drain regions 212A are doped semiconductor regions including a semiconductor material doped with dopants of a first conductivity type. The second active region 210A' includes a plurality of second source/drain regions 212A' on opposite sides of the gate structures 220A. The second source/drain regions 112A' are doped semiconductor regions including a semiconductor material doped with dopants of a second conductivity type. In some embodiments, the second conductivity type is the same as the first conductivity type. For example, in some embodiments, both of the first source/drain regions 212A and the second source/drain regions 212A' include p-type dopants for formation of p-type FETs. In other embodiments, both of the first source/drain regions 212A and the second source/drain regions 212A' include n-type dopants for formation of n-type FETs. In some embodiments, the second conductivity type is different from the first conductivity type. For example, in some embodiments, the first source/drain regions 212A includes p-type dopants for formation of p-type FETs, while the second source/drain regions 212A' includes n-type dopants for formation of n-type FETs, or vice versa.

The first active region 210A and the second active region 212 A' are electrically isolated from each other by one or more isolation structures 204A. In some embodiments, each of the one or more isolation structures 204A is a shallow trench isolation (STI) structure including a trench filled with one or more dielectric material. In some embodiments, the STI structures include silicon dioxide, silicon nitride, silicon oxynitride, or any other suitable insulating materials.

The gate structures 220A are over respective channel regions of the first active region 210A and second active regions 210A'. The gate structures 220A are separated from each other in the first direction X by a pitch P2. In some embodiments, the pitch P2 of the gate structures 220A is equal to the pitch P1 of the gate layout patterns 220 (FIG. 2A). In some embodiments, in order to accommodate one or more source/drain contacts 230A-1 having an increased width W2 (described below), the pitch P2 of the gate structure 220A is set to be greater than the pitch P1 of the gate layout patterns 220.

In some embodiments, each of the gate structures 220A includes a gate dielectric and a gate electrode. The gate dielectric is formed over a corresponding channel region of the first active region 210A and a corresponding channel region of the second active region 210A'. In some embodiments, the gate dielectric includes a high-k dielectric material. Exemplary high-k dielectric materials include, but are not limited to, silicon nitride, silicon oxynitride, HfO$_2$, HfSiO, HfSiON, HfTaO, HfTiO, HfZrO, metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, HfO$_2$—Al$_2$O$_3$ alloy, other suitable high-k dielectric materials, and/or combinations thereof. In some embodiments, the gate dielectric includes a stack of an interfacial dielectric material and a high-k dielectric material. In some embodiments, the interfacial dielectric material includes silicon dioxide. The gate electrode is formed over the gate dielectric. In some embodiments, the gate electrode includes a doped polysilicon. In other embodiments, the gate electrode includes a conductive material such as, for example Cu, Al, Ti, TiN, Ta, TaN, TaC, TaSiN, W, WN, or MoN.

The semiconductor device 200A further includes a plurality of first source/drain contacts 232A overlying corresponding first source/drain regions 212A and a plurality of second source/drain contacts 232A' overlying corresponding second source/drain regions 212A'. In some embodiments, the first and second source/drain contacts 232A and 232A' each include a conductive material such as, for example, Co, Cu, or W.

The first source/drain contacts 232A includes a first set of first source/drain contacts 232A-1 corresponding to the marked first source/drain contact layout patterns 232-1 of layout 200 and a second set of first source/drain contacts 232A-2 corresponding to the non-marked first source/drain contact layout patterns 232-2 of layout 200 (FIG. 2A). The first source/drain contacts 232A-1 in the first set have a width W2, while the first source/drain contacts 232A-2 in the second set have a width W1 smaller than W2. The spacing S2 between each first source/drain contact 232A-1 in the first set and a corresponding adjacent gate 220A thus is smaller than the spacing S1 between each first source/drain contact 232A-2 in the second set and a corresponding adjacent gate structure 220A.

The second source/drain contacts 232A' includes a first set of second source/drain contacts 232A'-1 corresponding to the marked second source/drain contact layout patterns 232'-1 of layout 200 and a second set of second source/drain contacts 232A'-2 corresponding to the non-marked second source/drain contact layout patterns 232'-2 of layout 200 (FIG. 2A). The second source/drain contacts 232A'-1 in the first set have a width W2, while the second source/drain contacts 232A'-2 in the second set have a width W1 smaller than W2. The spacing S4 between each second source/drain contact 232A'-1 in the first set and a corresponding adjacent gate structure 220A thus is smaller than the spacing S3 between each second source/drain contact 232A'-2 in the second set and a corresponding adjacent gate structure 220A. Precise dimensions for pitch P1, pitch P2, width W1, width W2, spacing S3 and spacing S4 are determined based on a node size of the FET being manufactured. In some embodiments, P1 ranges from about 40 nm to about 90 nm. If P1 is too small, then manufacturing of the device associated with the layout 100 has a higher risk of a defect, in some instances. If P1 is too large, then a size of the device associated with the layout 100 is unnecessarily increased, in some instances. In some embodiments, P2 ranges from about 40 nm to about 90 nm. If P2 is too small, then manufacturing of the device associated with the layout 100 has a higher risk of a defect, in some instances. If P2 is too large, then a size of the device associated with the layout 100 is unnecessarily increased, in some instances. In some embodiments, W1 ranges from about 16 nm to about 54 nm. If W1 is too small, then contact resistance is increased and a risk of the device associated with the layout 100 not meeting design specifications increases, in some instances. If W1 is too large then a size of the device associated with the layout 100 is unnecessarily increased, in some instances. In some embodiments, a ratio between W2 and W1 ranges from about 1 to about 5. If W2 is too small, then contact resistance is increased and a risk of the device associated with the layout 100 not meeting design specifications increases, in some instances. If W2 is too large then a size of the device associated with the layout 100 is unnecessarily increased, in some instances. In some embodiments, S3 ranges from about 10 nm to about 74 nm. If S3 is too small, then manufacturing of the device associated with the layout 100 has a higher risk of a defect, in some instances. If S3 is too large, then a size of the device associated with the layout 100 is unnecessarily increased, in some instances. In some embodiments, a ratio between S4 and S3 ranges from about 1 to about 5. If S4 is too small, then manufacturing of the device associated with the layout 100 has a higher risk of a defect, in some instances. If S4 is too large, then a size of the device associated with the layout 100 is unnecessarily increased, in some instances.

Forming source/drain contacts of different widths on a same active region, e.g., forming first source/drain contacts 232A of different widths on the first active region 210A, and forming second source/drain contacts 232A' of different widths on the second active region 210A', helps to reduce the overall contact resistance of the semiconductor device 200A, which helps to improve device performance.

The semiconductor device 200A further includes a plurality of first vias 242A overlying corresponding first source/drain contacts 232A and a plurality of second vias 242A' overlying corresponding second source/drain contacts 232A'. In some embodiments, the first vias 242A and the second vias 242A' each include a conductive material such as, for example, Co, Cu, or W.

The first vias 242A provide electrical connections to the corresponding first source/drain contacts 232A. The first vias 242A includes a first set of first vias 242A-1 overlying corresponding first set of first source/drain contacts 232A-1 of greater width W2 and a second set of first vias 242A-2 overlying corresponding second set of first source/drain contacts 232A-2 of smaller width W1. In some embodiments, the first set of first vias 242A-1 are also formed to have an increased dimension in the first direction X and/or the second direction Y.

The second vias 242A' provide electrical connections to the corresponding second source/drain contacts 232A'. The second vias 242A includes a first set of second vias 242A'-1 overlying corresponding first set of second source/drain contacts 232A'-1 of greater width W2 and a second set of second vias 242A'-2 overlying corresponding second set of second source/drain contacts 232A'-2 of smaller width W1. In some embodiments, the first set of second vias 242A'-1 are also formed to have an increased dimension in the first direction X and/or the second direction Y.

Forming vias 242A-1 and 242A'-1 with the increased dimension helps to further reduce the overall contact resistance of the semiconductor device 200A, which helps to further improve device performance.

The semiconductor device 200A further includes a plurality of interconnect structures 250A for signal routing. Each of interconnects structures 250A extends in the second direction Y across a corresponding pair of a first source/drain contact 232A and a second source/drain contact 242A'. Each of interconnects structures 250A is electrically coupled to a corresponding pair of a first source/drain contact 232A and a second source/drain contact 242A' via a corresponding pair of a first via 242A and a second via 242A'. The interconnect structures 250A are in a second metal layer M1, which is the second lowermost metal layer above the elements formed over the substrate 202A. In some embodiments, the interconnect structures 250A include a conductive material such as, for example, Co, Cu, or W.

Figure 3A:
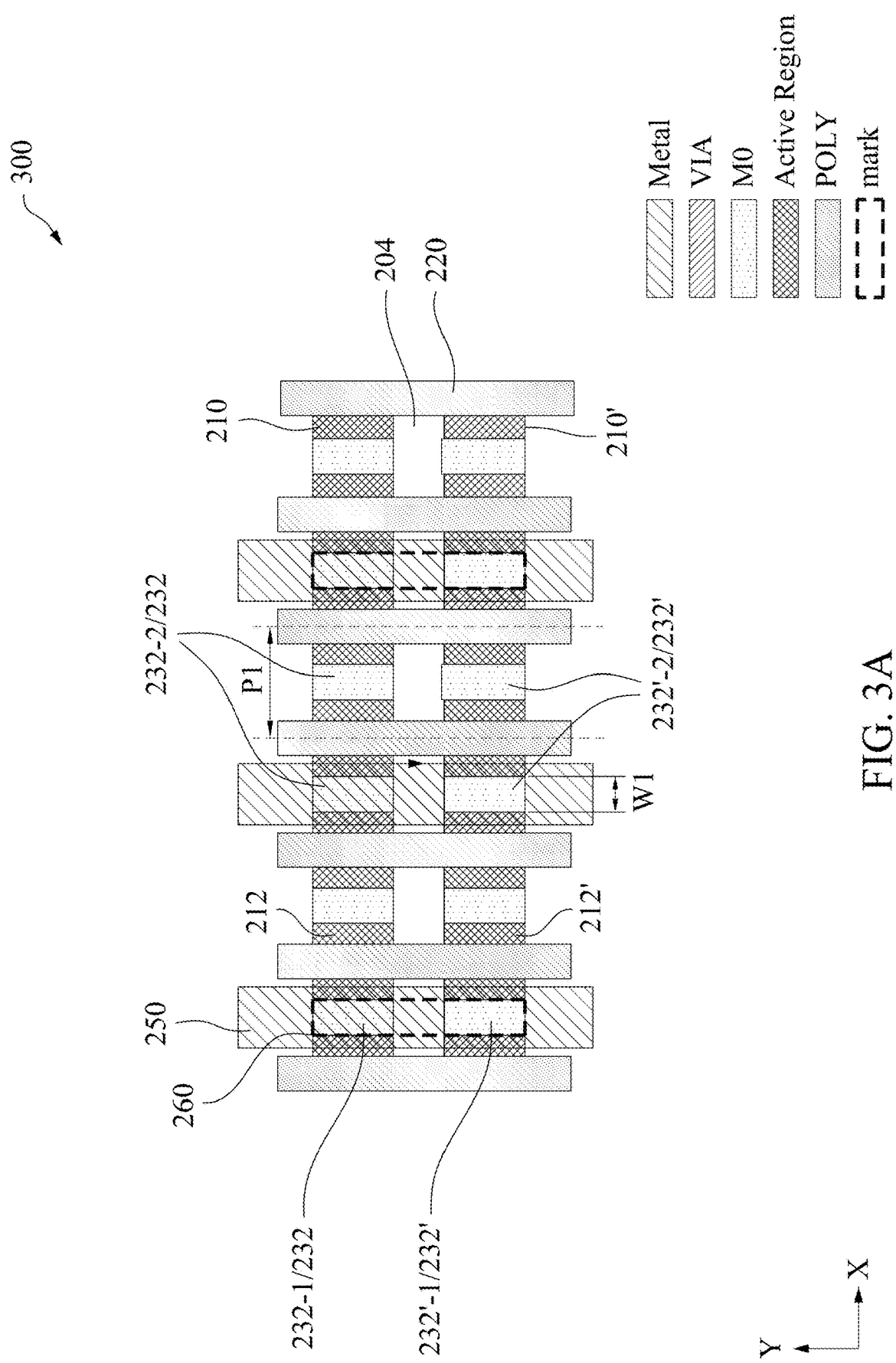
FIG. 3A is a diagram of a layout of a semiconductor device, in accordance with some embodiments.
Figure 3B:
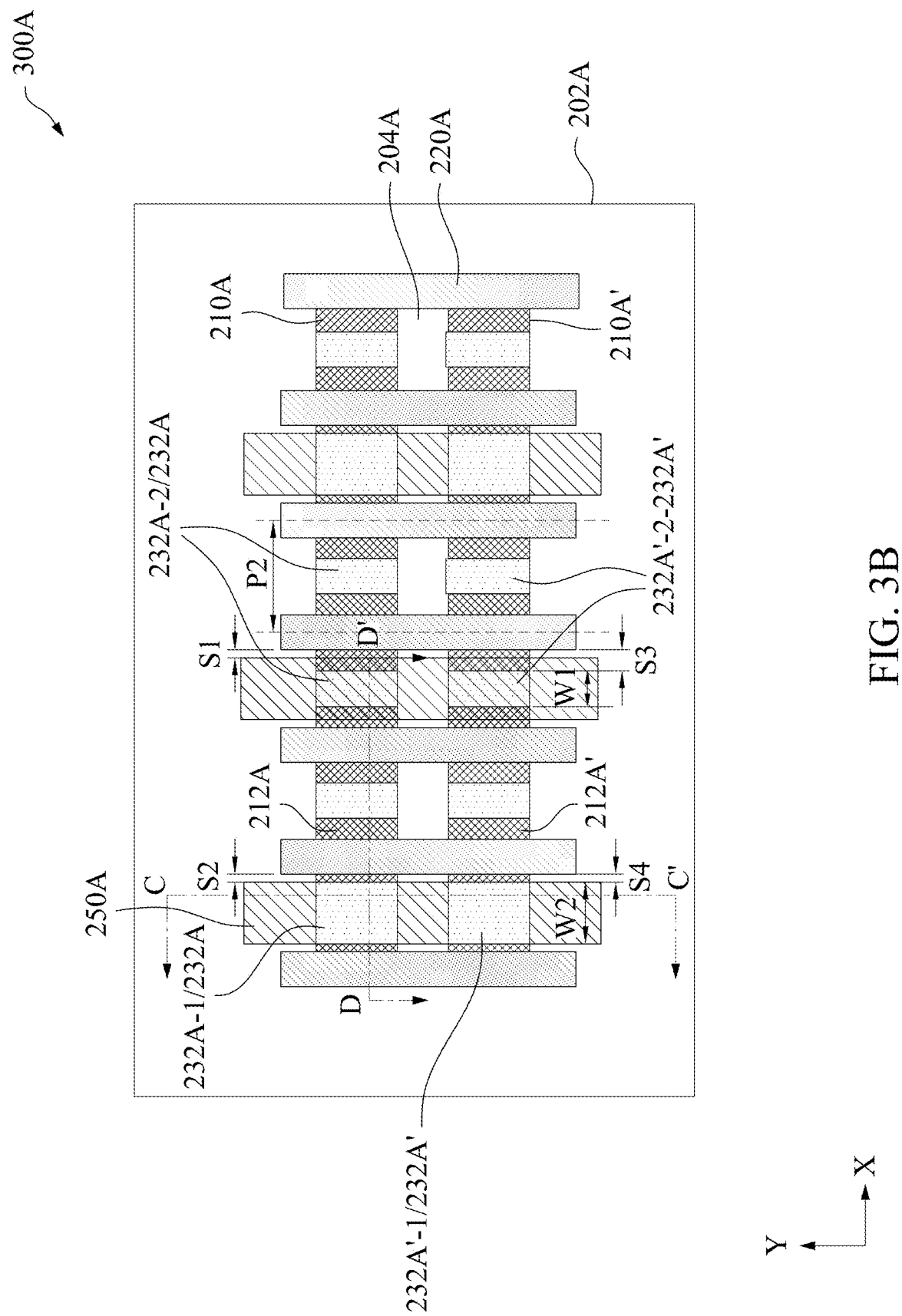
FIGS. 3B-3D are views of a semiconductor device having the layout of FIG. 3A, in accordance with some embodiments.
Figures 3C, 3D:
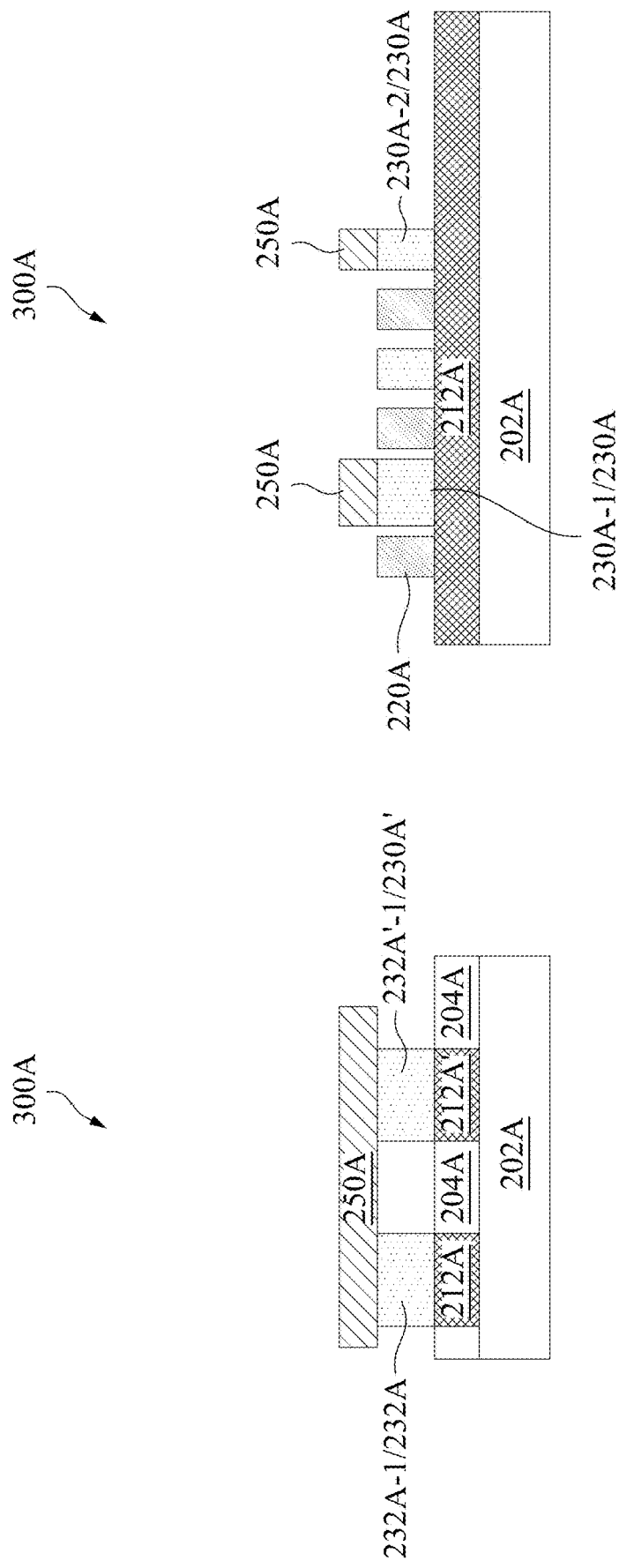

FIG. 3A is a diagram of a layout 300 of a semiconductor device, in accordance with some embodiments. The layout 300 is usable to manufacture a semiconductor device 300A (FIGS. 3B-3D). The layout 300 is a variation of layout 200 (FIG. 2A). Components that are the same or similar to those in FIG. 2A and FIG. 3A are given the same reference numbers, and detailed description thereof is thus omitted.

In comparison with the layout 200, the layout 300 does not contain via layout patterns 242 and 242'. In the layout 300, each of interconnect layout patterns 250 directly contacts a corresponding pair of a first source/drain contact layout pattern 232 and a second source/drain contact layout pattern 232' for signal routing. Because via layout patterns 242 and 242' are no longer present in the layout 300, each of one or more mark layers 260 in the layout 300 is only usable to indicate that a corresponding pair of a marked first source/drain contact layout pattern 232-1 and a marked second source/drain contact layout pattern 232'-1 have a width greater than a width W1 of a pair of a non-marked first source/drain contact layout pattern 232-2 and a non-marked second source/drain contact layout patterns 232'-2.

FIGS. 3B-3D are views of a semiconductor device 300A having the layout 300, in accordance with some embodiments. FIG. 3B is a top view of the semiconductor device 300A. FIG. 3C is a cross-sectional view of the semiconductor device 300A of FIG. 3B taken along line C-C'. FIG. 3D is a cross-sectional view of the semiconductor device 300A of FIG. 3B taken along line D-D'. The semiconductor device 300A is a non-limiting example for facilitating the illustration of the present disclosure.

The semiconductor device 300A is a variation of the semiconductor device 200A (FIGS. 2B-2D). Components that are the same or similar to those in FIGS. 2B-2D and FIGS. 3B-3D are given the same reference numbers, and detailed description thereof is thus omitted.

In comparison with the semiconductor device 200A, the semiconductor device 300A does not contain vias 242A and 242A'. In the semiconductor device 300A, each of interconnect structures 250A directly contacts a corresponding pair of a first source/drain contact 232A (e.g., 232A-1 or 232A-2) and a second source/drain contact 232A' (e.g., 232A'-1 or 232A'-2) for signal routing.

Figure 4:
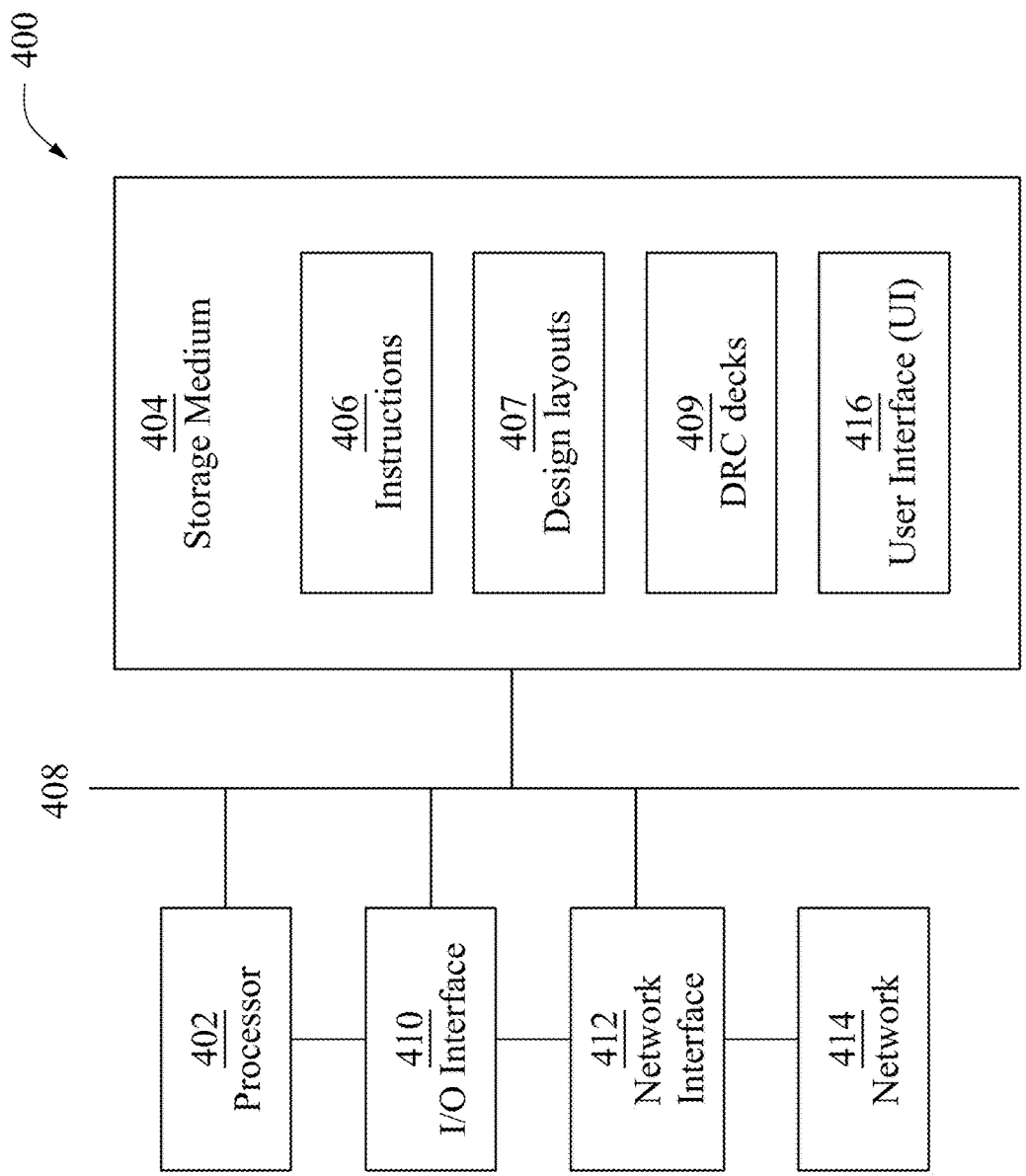
FIG. 4 is a schematic diagram of a system for designing a layout of a semiconductor device, in accordance with some embodiments.

FIG. 4 is a schematic diagram of an electronic design automation (EDA) system 400, in accordance with some embodiments. Methods described herein of generating design layouts, e.g., layouts 100, 200, and 300, in accordance with one or more embodiments, are implementable, for example, using EDA system 400, in accordance with some embodiments. In some embodiments, EDA system 400 is a general purpose computing device including a hardware processor 402 and a non-transitory, computer-readable storage medium 404. Computer-readable storage medium 404, amongst other things, is encoded with, i.e., stores, a set of executable instructions 406, design layouts 407, design rule check (DRC) decks 409 or any intermediate data for executing the set of instructions. Each design layout 407 comprises a graphical representation of an integrated chip, such as for example, a GSII file. Each DRC deck 409 comprises a list of design rules specific to a semiconductor process chosen for fabrication of a design layout 407. Execution of instructions 406, design layouts 407 and DRC decks 409 by hardware processor 402 represents (at least in part) an EDA tool which implements a portion or all of, e.g., the methods described herein in accordance with one or more (hereinafter, the noted processes and/or methods).

Processor 402 is electrically coupled to computer-readable storage medium 404 via a bus 408. Processor 402 is also electrically coupled to an I/O interface 410 by bus 408. A network interface 412 is also electrically connected to processor 402 via bus 408. Network interface 412 is connected to a network 414, so that processor 402 and computer-readable storage medium 404 are capable of connecting to external elements via network 414. Processor 402 is configured to execute instructions 406 encoded in computer-readable storage medium 404 in order to cause EDA system 400 to be usable for performing a portion or all of the noted processes and/or methods. In one or more embodiments, processor 402 is a central processing unit (CPU), a multi-processor, a distributed processing system, an application specific integrated circuit (ASIC), and/or a suitable processing unit.

In one or more embodiments, computer-readable storage medium 404 is an electronic, magnetic, optical, electromagnetic, infrared, and/or a semiconductor system (or apparatus or device). For example, computer-readable storage medium 404 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 404 includes a compact disk-read only memory (CD-ROM), a compact disk-read/write (CD-R/W), and/or a digital video disc (DVD).

In one or more embodiments, computer-readable storage medium 404 stores instructions 406, design layouts 407 and DRC decks 409 configured to cause EDA system 400 (where such execution represents (at least in part) the EDA tool) to be usable for performing a portion or all of the noted processes and/or methods. In one or more embodiments, storage medium 404 also stores information which facilitates performing a portion or all of the noted processes and/or methods.

EDA system 400 includes I/O interface 410. I/O interface 410 is coupled to external circuitry. In one or more embodiments, I/O interface 410 includes a keyboard, keypad, mouse, trackball, trackpad, touchscreen, and/or cursor direction keys for communicating information and commands to processor 402.

EDA system 400 also includes network interface 412 coupled to processor 402. Network interface 412 allows EDA system 400 to communicate with network 414, to which one or more other computer systems are connected. Network interface 412 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 400.

EDA system 400 is configured to receive information through I/O interface 410. The information received through I/O interface 410 includes one or more of instructions, data, design rules, libraries of standard cells, and/or other parameters for processing by processor 402. The information is transferred to processor 402 via bus 408. EDA system 400 is configured to receive information related to a user interface (UI) 416 through I/O interface 410. The information is stored in computer-readable medium 404 as UI 416.

In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 5:
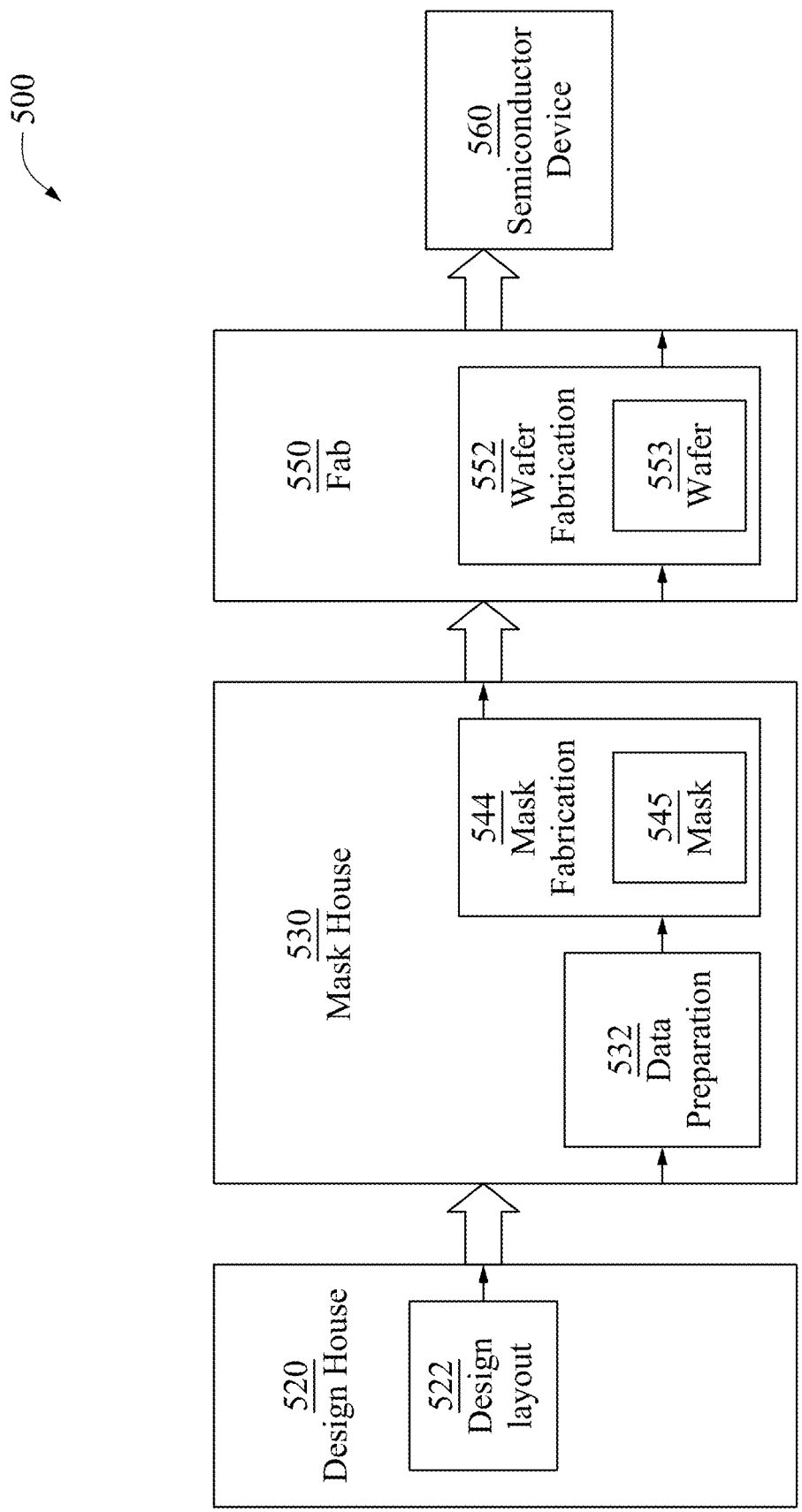
FIG. 5 is a block diagram of a semiconductor device manufacturing system, in accordance with some embodiments.

FIG. 5 is a block diagram of a semiconductor device manufacturing system 500, and a device manufacturing flow associated therewith, in accordance with some embodiments. In some embodiments, based on design layout, e.g., layout 100, 200, or 300, at least one of one or more semiconductor masks or at least one component in a layer of a semiconductor device is fabricated using manufacturing system 500.

In FIG. 5, device manufacturing system 500 includes entities, such as a design house 520, a mask house 530, and a semiconductor device manufacturer/fabricator ("fab") 550, that interact with one another in the design, development, and manufacturing cycles and/or services related to manufacturing semiconductor device 560. The entities in device manufacturing system 500 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 520, mask house 530, and fab 550 is owned by a single larger company. In some embodiments, two or more of design house 520, mask house 530, and fab 550 coexist in a common facility and use common resources.

Design house (or design team) 520 generates a design layout 522. Design layout 522 includes various geometrical patterns designed for a semiconductor device 560. The geometrical patterns correspond to patterns of metal, oxide, or semiconductor layers that make up the various components of semiconductor device 560 to be fabricated. The various layers combine to form various device features. For example, a portion of design layout 522 includes various circuit features, such as an active region, gate structures, source/drain contacts, and metal layer or vias of interconnection, to be formed in a substrate (such as a silicon wafer) and various material layers disposed on the substrate. Design house 520 implements a proper design procedure to form design layout 522. The design procedure includes one or more of logic design, physical design or place and route. Design layout 522 is presented in one or more data files having information of the geometrical patterns. For example, design layout 522 can be expressed in a GDSII file format or DFII file format.

Mask house 530 includes data preparation 532 and mask fabrication 544. Mask house 530 uses design layout 522 to manufacture one or more masks 545 to be used for fabricating the various layers of semiconductor device 560 according to design layout 522. Mask house 530 performs mask data preparation 532, where design layout 522 is translated into a representative data file ("RDF"). Mask data preparation 532 provides the RDF to mask fabrication 544. Mask fabrication 544 includes a mask writer. A mask writer converts the RDF to an image on a substrate, such as a mask (reticle) 545 or a semiconductor wafer 553. Design layout 522 is manipulated by mask data preparation 532 to comply with particular characteristics of the mask writer and/or requirements of fab 550. In FIG. 5, mask data preparation 532 and mask fabrication 544 are illustrated as separate elements. In some embodiments, mask data preparation 532 and mask fabrication 544 can be collectively referred to as mask data preparation.

In some embodiments, mask data preparation 532 includes optical proximity correction (OPC) which uses lithography enhancement techniques to compensate for image errors, such as those that can arise from diffraction, interference, other process effects and the like. OPC adjusts design layout 522. In some embodiments, mask data preparation 532 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 532 includes a mask rule checker (MRC) that checks design layout 522 that has undergone processes in OPC with a set of mask creation rules which contain certain geometric and/or connectivity restrictions to ensure sufficient margins, to account for variability in semiconductor manufacturing processes, and the like. In some embodiments, the MRC modifies design layout diagram 522 to compensate for limitations during mask fabrication 544, which may undo part of the modifications performed by OPC in order to meet mask creation rules.

In some embodiments, mask data preparation 532 includes lithography process checking (LPC) that simulates processing that will be implemented by fab 550 to fabricate semiconductor device 560. LPC simulates this processing based on design layout 622 to create a simulated manufactured device, such as semiconductor device 560. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine design layout 522.

One of ordinary skill would understand that the above description of mask data preparation 532 has been simplified for the purposes of clarity. In some embodiments, data preparation 532 includes additional features such as a logic operation (LOP) to modify design layout 522 according to manufacturing rules. Additionally, the processes applied to design layout 522 during data preparation 532 may be executed in a variety of different orders.

After mask data preparation 532 and during mask fabrication 544, a mask 545 or a group of masks 545 are fabricated based on design layout 522. In some embodiments, mask fabrication 544 includes performing one or more lithographic exposures based on design layout 522. In some embodiments, an electron-beam (e-beam) or a mechanism of multiple e-beams is used to form a pattern on a mask (e.g., a photomask, or a reticle) 545 based on design layout 522. Mask 545 can be formed in various technologies. In some embodiments, mask 545 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque regions and transmits through the transparent regions. In one example, a binary mask version of mask 545 includes a transparent substrate (e.g., fused quartz) and an opaque material (e.g., chromium) coated in the opaque regions of the binary mask. In another example, mask 545 is formed using a phase shift technology. In a phase shift mask (PSM) version of mask 545, various features in the pattern formed on the phase shift mask are configured to have proper phase difference to enhance the resolution and imaging quality. In various examples, the phase shift mask can be attenuated PSM or alternating PSM. The mask(s) generated by mask fabrication 644 is used in a variety of processes. For example, such a mask(s) is used in an ion implantation process to form various doped regions in semiconductor wafer 553, in an etching process to form various etching regions in semiconductor wafer 553, and/or in other suitable processes.

Fab 550 includes wafer fabrication 552. Fab 550 is an IC fabrication business that includes one or more manufacturing facilities for the fabrication of a variety of different IC products. In some embodiments, fab 550 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (BEOL fabrication), and a third manufacturing facility may provide other services for the foundry business.

Fab 550 uses mask(s) 545 fabricated by mask house 530 to fabricate semiconductor device 560. Thus, fab 550 at least indirectly uses design layout 522 to fabricate semiconductor device 560. In some embodiments, semiconductor wafer 553 is fabricated by fab 550 using mask(s) 545 to form semiconductor device 560. In some embodiments, the device fabrication includes performing one or more lithographic exposures based at least indirectly on design layout 522. Semiconductor wafer 553 includes a silicon substrate or other proper substrate having material layers formed thereon. Semiconductor wafer 553 further includes one or more of various doped regions, dielectric features, multilevel interconnects, and the like (formed at subsequent manufacturing steps).

Details regarding an integrated circuit (IC) manufacturing system (e.g., IC manufacturing system 600 of FIG. 6), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

One aspect of this description relates to a semiconductor device. The semiconductor device includes an active region in a substrate. The active region extends in a first direction. The semiconductor device further includes a gate structure extending in a second direction different from the first direction. The gate structure extends across the active region. The semiconductor device further includes a plurality of source/drain contacts extending in the second direction and overlapping a plurality of source/drain regions in the active region on opposite sides of the gate structure. A first source/drain contact of the plurality of source/drain contacts has a first width, and a second source/drain contact of the plurality of source/drain contacts has a second width less than the first width. In some embodiments, the semiconductor device further includes a conductive layer extending in the first direction. The conductive layer is electrically coupled to the first source/drain contact and the second source/drain contact. In some embodiments, the semiconductor device further includes a first via. The first via electrically couples the conductive layer to the first source/drain contact. In some embodiments, the semiconductor device further includes a second via. The second via electrically couples the conductive layer to the second source/drain contact. In some embodiments, the first via has a dimension greater than a dimension of the second via. In some embodiments, a spacing between the first source/drain contact and the gate structure is smaller than a spacing between the second source/drain contact and the gate structure.

Another aspect of this description relates to a semiconductor device. The semiconductor device includes a plurality of active regions in a substrate. Each of the plurality of active regions extends in a first direction and is separated from one another in a second direction different from the first direction. The semiconductor device further includes a plurality of gate structures extending in the second direction. Each of the plurality of gate structures extends across each active region of the plurality of active regions. The semiconductor device further includes a plurality of first source/drain contacts extending in the second direction and overlapping a plurality of first source/drain regions in a first active region of the plurality of active regions on opposite sides of the plurality of gate structures. A first set of first source/drain contacts of the plurality of first source/drain contacts have a first width, and a second set of first source/drain contacts of the plurality of first source/drain contacts have a second width less than the first width. The semiconductor device further includes a plurality of second source/drain contacts extending in the second direction and overlapping a plurality of second source/drain regions in a second active region of the plurality of active regions on opposite sides of the plurality of gate structures. A first set of second source/drain contacts of the plurality of second source/drain contacts have the first width, and a second set of second source/drain contacts of the plurality of second source/drain contacts have the second width. The semiconductor device further includes a plurality of interconnect structures extending in the second direction. Each interconnect structure of the plurality of interconnect structures is electrically coupled to a corresponding first source/drain contact of the plurality of first source/drain contacts and a corresponding second source/drain contact of the plurality of second source/drain contacts. In some embodiments, the semiconductor device further includes one or more isolation structures separating the plurality of active regions from one another. In some embodiments, at least one interconnect structure of the plurality of interconnect structures is in direct contact with the corresponding first source/drain contact of the plurality of first source/drain contacts and the corresponding second source/drain contact of the plurality of second source/drain contacts. In some embodiments, the semiconductor device further includes a plurality of first vias coupling the plurality of interconnect structures to corresponding first source/drain contacts of the plurality of first source/drain contacts and a plurality of second vias coupling the plurality of interconnect structures to corresponding second source/drain contacts of the plurality of second source/drain contacts. In some embodiments, each interconnect structure of the plurality of interconnect structures is coupled to the corresponding first source/drain contact of the plurality of first source/drain contacts through a corresponding first via of the plurality of first vias, and to the corresponding second source/drain contact of the plurality of second source/drain contacts through a corresponding second via of the plurality of second vias. In some embodiments, a first set of first vias of the plurality of first vias contacting the first set of first source/drain contacts of the plurality of first source/drain contacts have a dimension greater than a dimension of a second set of first vias of the plurality of first vias contacting the second set of first source/drain contacts of the plurality of first source/drain contacts. In some embodiments, a first set of second vias of the plurality of second vias contacting the first set of second source/drain contacts of the plurality of second source/drain contacts have a dimension greater than a dimension of a second set of second vias of the plurality of second vias contacting the second set of second source/drain contacts of the plurality of second source/drain contacts. In some embodiments, adjacent gate structures of the plurality of gate structures have a uniform pitch. In some embodiments, the plurality of first source/drain regions includes dopants of a first conductivity type, and the plurality of second source/drain regions includes dopants of a second conductivity type. In some embodiments, the first conductivity is the same as the second conductivity type. In some embodiments, the first conductivity is different from the second conductivity type.

Still another aspect of this description relates to a system for processing a layout of a semiconductor device. The system includes at least one processor, and a computer readable storage medium connected to the at least one processor. The at least one processor is configured to execute instructions stored on the computer readable storage medium to generate an active region layout pattern extending in a first direction, generate a plurality of gate layout patterns extending in a second direction different from the first direction, wherein the plurality of gate layout patterns extends across the active region layout pattern, generate a plurality of source/drain region layout patterns in the active region layout pattern on opposite sides of the plurality of gate layout patterns, generate a plurality of source/drain contact layout patterns overlapping the plurality of source/drain region layout patterns, and generate one or more mark layers. Each of one or more mark layers labels a corresponding source/drain contact layout pattern of the plurality of source/drain contact layout patterns and is usable to indicate the corresponding source/drain layout pattern of the plurality of source/drain contact layout patterns has a width greater than each source/drain layout pattern of the plurality of source/drain contact layout patterns that is not labeled by the one or more mark layers. In some embodiments, the at least one processor is further configured to execute instructions on the computer readable storage medium to generate a conductive layer layout pattern electrically coupled to corresponding source/drain contact layout patterns of the plurality of source/drain contact layout patterns. In some embodiments, the at least one processor is further configured to execute instructions on the computer readable storage medium to generate a plurality of via layout patterns. The plurality of via layout patterns electrically couples the conductive layer layout pattern to the corresponding source/drain contact layout patterns of the plurality of source/drain contact layout patterns.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device comprising:
   an active region in a substrate, wherein the active region extends in a first direction;
   a gate structure extending in a second direction different from the first direction, wherein the gate structure extends across the active region; and
   a plurality of source/drain contacts extending in the second direction and overlapping a plurality of source/drain regions in the active region on opposite sides of the gate structure, wherein a first source/drain contact of the plurality of source/drain contacts has a first width, a second source/drain contact of the plurality of source/drain contacts has a second width less than the first width, and a spacing between the first source/drain contact and the gate structure is smaller than a spacing between the second source/drain contact and the gate structure.

2. The semiconductor device of claim 1, further comprising a conductive layer extending in the first direction, wherein the conductive layer is electrically coupled to the first source/drain contact and the second source/drain contact.

3. The semiconductor device of claim 2, further comprising a first via, wherein the first via electrically couples the conductive layer to the first source/drain contact.

4. The semiconductor device of claim 3, further comprising a second via, wherein the second via electrically couples the conductive layer to the second source/drain contact.

5. The semiconductor device of claim 4, wherein the first via has a dimension greater than a dimension of the second via.

6. The semiconductor device of claim 1, wherein the second width is constant in a third direction perpendicular to both the first direction and the second direction.

7. A semiconductor device comprising:
   a plurality of active regions in a substrate, wherein each of the plurality of active regions extends in a first direction and is separated from one another in a second direction different from the first direction;
   a plurality of gate structures extending in the second direction, wherein each of the plurality of gate structures extends across each active region of the plurality of active regions;
   a plurality of first source/drain contacts extending in the second direction and overlapping a plurality of first source/drain regions in a first active region of the plurality of active regions on opposite sides of the plurality of gate structures, wherein a first set of first source/drain contacts of the plurality of first source/drain contacts have a first width, a second set of first source/drain contacts of the plurality of first source/drain contacts have a second width, the first width and the second width are constant in a direction perpendicular to a top surface of the substrate, and the second width less than the first width;
   a plurality of second source/drain contacts extending in the second direction and overlapping a plurality of second source/drain regions in a second active region of the plurality of active regions on opposite sides of the plurality of gate structures, wherein a first set of second source/drain contacts of the plurality of second source/drain contacts have the first width, and a second set of second source/drain contacts of the plurality of second source/drain contacts have the second width; and
   a plurality of interconnect structures extending in the second direction, wherein each interconnect structure of the plurality of interconnect structures is electrically coupled to a corresponding first source/drain contact of the plurality of first source/drain contacts and a corresponding second source/drain contact of the plurality of second source/drain contacts.

8. The semiconductor device of claim 7, further comprising one or more isolation structures separating the plurality of active regions from one another.

9. The semiconductor device of claim 7, wherein at least one interconnect structure of the plurality of interconnect structures is in direct contact with the corresponding first source/drain contact of the plurality of first source/drain contacts and the corresponding second source/drain contact of the plurality of second source/drain contacts.

10. The semiconductor device of claim 7, further comprising a plurality of first vias coupling the plurality of interconnect structures to corresponding first source/drain contacts of the plurality of first source/drain contacts and a plurality of second vias coupling the plurality of interconnect structures to corresponding second source/drain contacts of the plurality of second source/drain contacts.

11. The semiconductor device of claim 10, wherein each interconnect structure of the plurality of interconnect structures is coupled to the corresponding first source/drain contact of the plurality of first source/drain contacts through a corresponding first via of the plurality of first vias, and to the corresponding second source/drain contact of the plurality of second source/drain contacts through a corresponding second via of the plurality of second vias.

12. The semiconductor device of claim 10, wherein a first set of first vias of the plurality of first vias contacting the first set of first source/drain contacts of the plurality of first source/drain contacts have a dimension greater than a dimension of a second set of first vias of the plurality of first vias contacting the second set of first source/drain contacts of the plurality of first source/drain contacts.

13. The semiconductor device of claim 10, wherein a first set of second vias of the plurality of second vias contacting the first set of second source/drain contacts of the plurality of second source/drain contacts have a dimension greater than a dimension of a second set of second vias of the plurality of second vias contacting the second set of second source/drain contacts of the plurality of second source/drain contacts.

14. The semiconductor device of claim 7, wherein adjacent gate structures of the plurality of gate structures have a uniform pitch.

15. The semiconductor device of claim 7, wherein the plurality of first source/drain regions comprises dopants of a first conductivity type, and the plurality of second source/drain regions comprises dopants of a second conductivity type.

16. The semiconductor device of claim 15, wherein the first conductivity is the same as the second conductivity type.

17. The semiconductor device of claim 15, wherein the first conductivity is different from the second conductivity type.

18. A semiconductor device comprising:
an active region in a substrate, wherein the active region extends in a first direction;
a gate structure extending in a second direction different from the first direction, wherein the gate structure overlaps the active region;
a conductive layer extending in the first direction, wherein the conductive layer overlaps a portion of the gate structure;
a first source/drain (S/D) contact extending in the second direction, wherein the first S/D contact overlaps the active region on a first side of the gate structure, and an upper-most portion of the first S/D contact is a first distance from the gate structure;
a second S/D contact extending in the second direction, wherein the second S/D contact overlaps the active region on a second side of the gate structure opposite the first side, an upper-most portion of the second S/D contact is a second distance from the gate structure, and the second distance is different from the first distance;
a first via electrically connecting the conductive layer to the first S/D contact, wherein the first via has a first width in the first direction; and
a second via electrically connecting the conductive layer to the second S/D contact, wherein the second via has a second width in the first direction, and the second width is less than the first width.

19. The semiconductor device of claim 18, wherein the first S/D contact has a third width in the first direction, the second S/D contact has a fourth width in the first direction, and the third width is greater than the fourth width.

20. The semiconductor device of claim 19, wherein the third width is equal to the first width.

* * * * *